United States Patent
Im

(10) Patent No.: US 7,474,694 B2
(45) Date of Patent: Jan. 6, 2009

(54) METHODS, DEVICES AND COMPUTER PROGRAM PRODUCTS FOR ADAPTIVELY ADJUSTING PASSBANDS OF HIGH-PASS FILTERS OF ASYMMETRIC DIGITAL SUBSCRIBER LINK (ADSL) MODEMS

(75) Inventor: Joon-hyuk Im, Seoul (KR)

(73) Assignee: Samsung Electronics Co., Ltd. (KR)

( * ) Notice: Subject to any disclaimer, the term of this patent is extended or adjusted under 35 U.S.C. 154(b) by 646 days.

(21) Appl. No.: 10/435,969

(22) Filed: May 12, 2003

(65) Prior Publication Data

US 2003/0227966 A1 Dec. 11, 2003

(30) Foreign Application Priority Data

Jun. 5, 2002 (KR) ................. 2002-31676

(51) Int. Cl.
*H04B 1/38* (2006.01)

(52) U.S. Cl. ................. 375/222; 375/147; 375/219; 375/350; 375/240; 455/245.1; 455/246.1; 455/234.1

(58) Field of Classification Search ............... 375/222, 375/346, 232, 296, 219, 350, 240; 455/266, 455/250, 234.1, 245.1, 246.1
See application file for complete search history.

(56) References Cited

U.S. PATENT DOCUMENTS 5,499,369 A * 3/1996 Atkinson ................. 719/315
5,995,567 A * 11/1999 Cioffi et al. .............. 375/346
6,034,993 A * 3/2000 Norrell et al. ............. 375/232
6,198,778 B1 * 3/2001 Mestdagh ................. 375/296
7,027,790 B2 * 4/2006 Westra et al. ............ 455/250.1
2001/0021250 A1 9/2001 Vanderbauwhede et al.

FOREIGN PATENT DOCUMENTS

WO WO 00/79693 12/2000

OTHER PUBLICATIONS

"Notice to Submit Response," from the Korean Intellectual Property Office, corresponding to Korean Patent Application No. 2002-31676, dated Sep. 13, 2004.

* cited by examiner

*Primary Examiner*—Chieh M. Fan
*Assistant Examiner*—Eva Puente
(74) *Attorney, Agent, or Firm*—Myers Bigel Sibley & Sajovec

(57) ABSTRACT

The present invention provides methods and related devices for adjusting the passband and/or cutoff frequency of a high-pass filter of an ADSL modem. A level of a received ADSL signal is compared with a predetermined signal level to provide a comparison result. A control signal is generated based on the comparison result and the passband and/or the cutoff frequency of the high-pass filter is adjusted responsive to the control signal. Devices and computer program products are also provided.

18 Claims, 4 Drawing Sheets

| RVP, RVN (Ω) | 0Kft | 3Kft | 6Kft | 9Kft | 12Kft | 15Kft | 18Kft |
|---|---|---|---|---|---|---|---|
| 0.22K | 9376 Kbps | 9728 Kbps | 8960 Kbps | 7808 Kbps | 4376 Kbps | 1792 Kbps | 448 Kbps |
| 1K | 9472 Kbps | 10112 Kbps | 9472 Kbps | 7744 Kbps | 4000 Kbps | 1408 Kbps | 96 Kbps |

METHODS, DEVICES AND COMPUTER PROGRAM PRODUCTS FOR ADAPTIVELY ADJUSTING PASSBANDS OF HIGH-PASS FILTERS OF ASYMMETRIC DIGITAL SUBSCRIBER LINK (ADSL) MODEMS

RELATED APPLICATION

This application is related to and claims priority from Korean Application No. 2002-31676, filed Jun. 5, 2002, the disclosure of which is hereby incorporated herein by reference.

FIELD OF THE INVENTION

The present invention relates to methods of filtering and related devices, and more particularly, to methods for adjusting a passband and/or a cutoff frequency of a filter.

BACKGROUND OF THE INVENTION

Generally, using existing infrastructure, i.e. established telephone lines, an asymmetric digital subscriber link (ADSL) modem provides analog call services and simultaneously provides high-speed digital services, such as data services and Internet services, without interfering with traditional analog call services.

Referring to FIG. 1, a schematic block diagram of conventional ADSL remote terminal (RT) modems will be discussed. As illustrated, the ADSL RT modem 10 includes an input/output terminal (TP), a transformer 2, a hybrid 3, a line driver (LD) 4, a high-pass filter (HPF) 5, an analog front end (AFE) 6, and a discrete multitone transceiver (DMT) 7.

A signal that is received by the input/output terminal (TP) connected to a twisted pair wire is sent to the hybrid 3 through the transformer 2. The hybrid 3 separates the received signal from a transmitted signal, and transmits the received signal to the high-pass filter 5.

The high-pass filter 5 receives the output signal of the hybrid 3, high-pass filters the signal, and outputs the result to the analog front end 6. The analog front end 6 receives the output signal of the high-pass filter 5, anti-aliases the signal, and converts the result into a digital signal.

The discrete multitone transceiver 7 receives the output signal of the analog front end 6, demodulates the output signal of the analog front end 6 complying with an ADSL standard demodulation method, i.e., the American National Standards Institute (ANSI) standard, and outputs the modulated signal to a host through a predetermined interface.

Furthermore, the digital signal generated in the discrete multitone transceiver 7 is sent to the analog front end 6. The analog front end 6 receives the output signal of the discrete multitone transceiver 7, converts the signal into an analog signal, filters the signal, and outputs the result to the line driver 4.

The line driver 4 amplifies the output signal of the analog front end 6, and outputs the amplified signal to the hybrid 3. The hybrid 3 separates a transmitted signal from a received signal, and outputs the transmitted signal to the transformer 2. The output signal of the transformer 2 is sent to the twisted pair line through the input/output terminal (TP).

The high-pass filter 5 cuts off the output signal of the line driver 4, i.e. the transmitted signal, and a voice signal that is input through the input/output terminal (TP). However, since the passband or cutoff frequency of the high-pass filter 5 is constant regardless of the distance between communications service providers and the ADSL RT modem 10, the data rate of the ADSL RT modem 10 may decrease if the distance between the communications service providers and the ADSL RT modem 10 increases.

SUMMARY OF THE INVENTION

Embodiments of the present invention provide for adjusting the passband and/or cutoff frequency of high-pass filters of asymmetric digital subscriber link (ADSL) modems. A level of a received ADSL signal is compared with a predetermined signal level to provide a comparison result. A control signal is generated based on the comparison result and the passband and/or the cutoff frequency of the high-pass filter is adjusted responsive to the control signal.

In some embodiments of the present invention, the passband and/or cutoff frequency may be adjusted by adjusting the value of at least one resistive element of the high pass filter. In certain embodiments the control signal may be set to a logic low if the level of the received ADSL signal is lower than the predetermined signal level and set to a logic high if the level of the received ADSL signal is higher than the predetermined signal level.

In further embodiments of the present invention, a switch may be activated and/or deactivated responsive to the control signal. In certain embodiments, the switch may activate and/or deactivate the at least one resistive element.

While the present invention is described above primarily with reference to methods of operating integrated circuit devices, devices and computer program products are also provided.

DETAILED DESCRIPTION OF EMBODIMENTS OF THE PRESENT INVENTION

Figure 1:
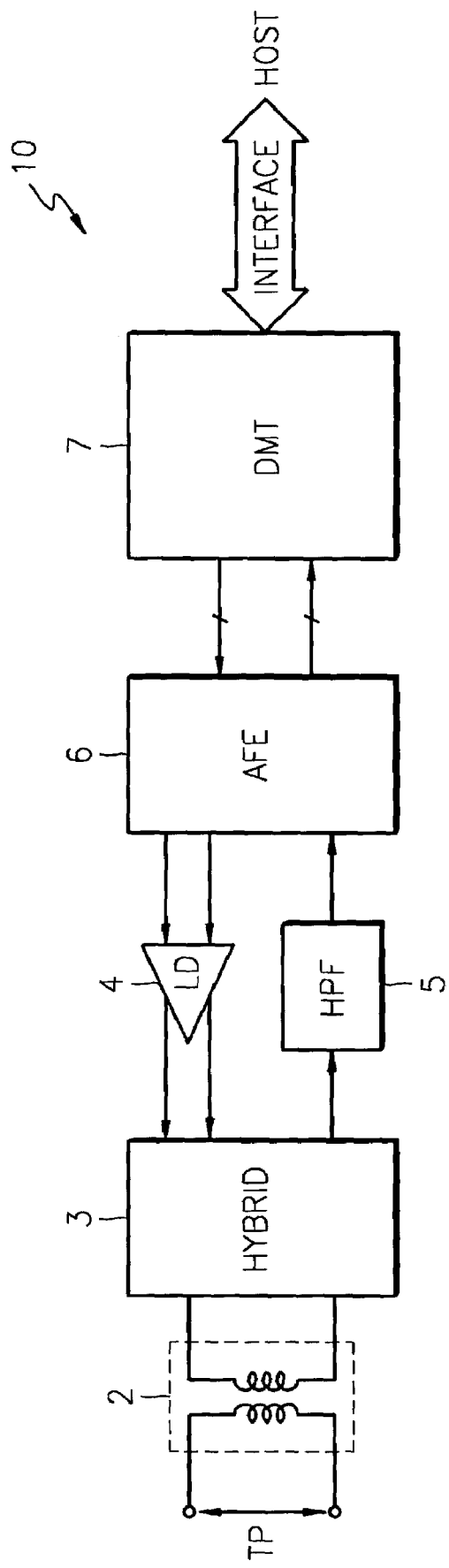
FIG. 1 is a schematic block diagram illustrating conventional asymmetric digital subscriber link (ADSL) remote terminal (RT) modems.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

As will be appreciated by one of skill in the art, the present invention may be embodied as a method, modem, data processing system, and/or computer program product. Accordingly, the present invention may take the form of an entirely hardware embodiment, an entirely software embodiment or an embodiment combining software and hardware aspects all generally referred to herein as a "circuit" or "module." Furthermore, the present invention may take the form of a computer program product on a computer usable storage medium having computer-usable program code means embodied in the medium. Any suitable computer readable medium may be used including hard drives, CD-ROMs, optical storage devices and/or magnetic storage devices.

Computer program code for carrying out operations of the present invention may be written in an object oriented programming language, such as Java® or C++. However, the computer program code for carrying out operations of the present invention may also be written in conventional procedural programming languages, such as the "C" programming language or assembly language. The program code may execute entirely on the user's computer, partly on the user's computer, as a stand alone software package, partly on the user's computer and partly on a remote computer, or entirely on the remote computer. In the latter scenario, the remote computer may be connected to the user's computer through a local area network (LAN) or a wide area network (WAN).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

These computer program instructions may also be stored in a computer-readable memory that can direct a computer or other programmable data processing apparatus to operate in a particular manner, such that the instructions stored in the computer-readable memory produce an article of manufacture including instruction means which implement the acts specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the acts specified in the flowchart and/or block diagram block or blocks.

Embodiments of the present invention will be described below with respect to FIGS. 2 through 5. Embodiments of the present invention provide methods and devices for adjusting the passband and/or cutoff frequency of a high-pass filter. A level of a received ADSL signal (for example the amplitude of the received signal) is compared with a predetermined signal level (a threshold signal amplitude). A control signal is output to a high-pass filter based on whether the received signal is greater or less than the threshold value. This control signal may then be used by the high-pass filter to adjust the passband and/or the cutoff frequency of the high-pass filter. The ability to control the passband and/or cutoff frequency of the high-pass filter may enable signals to be received at increased data rates as discussed herein.

Figure 2:
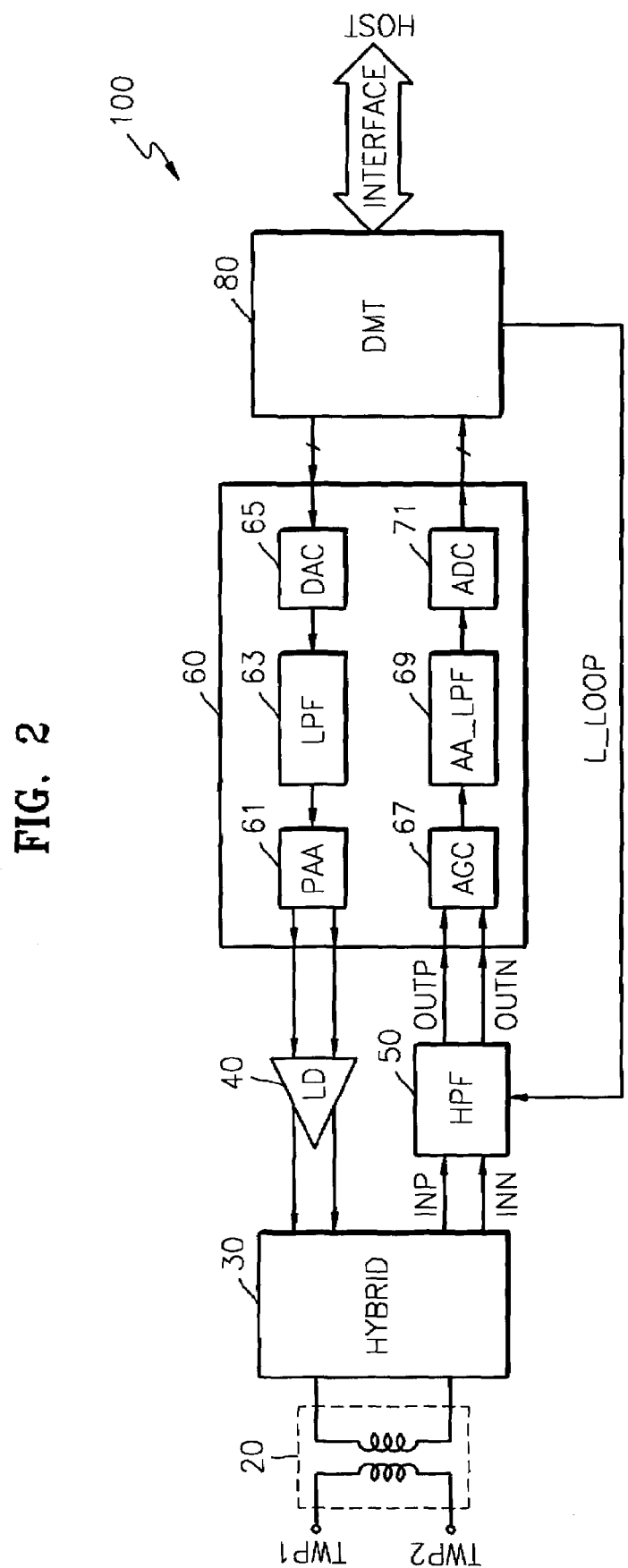
FIG. 2 is a schematic block diagram illustrating ADSL RT modems having high-pass filters (HPFs) according to embodiments of the present invention.

Referring now to FIG. 2, a schematic block diagram of symmetric digital subscriber link (ADSL) remote terminal (RT) modems having high-pass filters (HPFs) according to embodiments of the present invention will be discussed. As illustrated in FIG. 2, the ADSL RT modem 100 includes a pair of input/output terminals TWP1 and TWP2, a transformer 20, a hybrid 30, a line driver (LD) 40, a high-pass filter (HPF) 50, an analog front end (AFE) 60, and a discrete multitone transceiver (DMT) 80. The ADSL RT modem 100 receives a signal and at the same time transmits a signal through the pair of input/output terminals TWP1 and TWP2.

As further illustrated in FIG. 2, the analog front end 60 includes a programmable attenuation amplifier (PAA) 61, a low pass filter (LPF) 63, a digital-to-analog converter (DAC) 65, an automatic gain control circuit (AGC) 67, an anti-aliasing-low pass filter (AA-LPF) 69, and an analog-to-digital converter 71. It will be understood that analog front ends according to embodiments of the present invention are not limited to the configuration illustrated in FIG. 2 and that this configuration is provided for exemplary purposes only.

A signal may be received through the pair of input/output terminals TWP1 and TWP2 coupled to, for example, a twisted pair wire. The received signal is sent to the hybrid 30 through the transformer 20. The hybrid 30 separates the received signal and a transmitted signal, and sends the received signal to the high-pass filter 50. As illustrated, the received circuit includes the pair of the input/output terminals TWP1 and TWP2, the transformer 20 and the hybrid 30.

The high-pass filter 50 receives the output signals INP and INN of the hybrid 30, high-pass filters the signals, and outputs the results OUTP and OUTN to the analog front end 60. In certain embodiments of the present invention, the high-pass filter 50 includes resistors (R), inductors (L), and capacitors (C), as illustrated, for example, in FIGS. 3 and 4. Furthermore, the passband or cutoff frequency of the high-pass filter 50 typically varies with respect to a resistance value.

The automatic gain control circuit 67 receives the output signals OUTP and OUTN of the high-pass filter 50, amplifies the signals, and outputs the amplified signals to the anti-aliasing-low pass filter 69. The anti-aliasing-low pass filter 69 receives the output signal of the automatic gain control circuit 67, reduces or removes aliasing, and outputs the result to the analog-to-digital converter 71. The analog-to-digital converter 71 converts the output signal of the anti-aliasing-low pass filter 69 into a digital signal, and outputs the result to the discrete multitone transceiver 80. In other words, the analog front end 60 receives the output signals OUTP and OUTN of the high-pass filter 50, converts the signal into a digital signal, and outputs the digital signal to the discrete multitone transceiver (DMT) 80.

The discrete multitone transceiver 80 receives the output signal of the analog front end 60, demodulates the output signal of the analog front end 60 complying with the ADSL standard demodulation method, for example, the American National Standards Institute (ANSI) standard, and outputs the demodulated signal to a host or a personal computer (PC) through a predetermined interface.

The discrete multitone transceiver 80 compares the level of the received signal, for example, a voltage level of the received signal, that is provided through the high-pass filter 50 and the analog front end 60, to a predetermined reference level (threshold), and outputs a control signal L_LOOP corresponding to the comparison result to the high-pass filter 50. In certain embodiments of the present invention, the high-pass filter 50 can vary the passband or cutoff frequency of the high-pass filter 50 in response to the control signal L_LOOP.

In particular, if the level of the received signal is lower than the predetermined reference level, the discrete multitone transceiver 80 outputs a deactivated control signal L_LOOP, for example, a logic "low" signal, to the high-pass filter 50. If, on the other hand, the level of the received signal is higher than the predetermined reference level (threshold), the discrete multitone transceiver 80 outputs an activated control signal L_LOOP, for example, a logic "high" signal, to the high-pass filter 50. For example, the discrete multitone transceiver 80 may output a deactivated control signal L_LOOP when, for example, the gain of the analog gain control circuit 67 is less than 30 dB. Similarly, the discrete multitone transceiver 80 may output an activated control signal L_LOOP when, for example, the gain of the analog gain control circuit 67 is greater than or equal to 30 dB.

The discrete multitone transceiver 80 receives an input signal from the host through the interface, modulates the input signal from the host and outputs the modulated signal to the analog front end 60. In particular, the digital signal generated in the discrete multitone transceiver 80 is sent to the digital-to-analog converter 65 of the analog front end 60. The digital-to-analog converter 65 receives the output signal of the discrete multitone transceiver 80, converts the signal into an analog signal, and outputs the analog signal to the low pass filter 63.

The low pass filter 63 filters the output signal of the digital-to-analog converter 65 and outputs the result to the programmable attenuation amplifier 61. The programmable attenuation amplifier 61 lowers the level of the output signal of the low pass filter 63, and outputs the signal to the line driver 40. The line driver 40 amplifies the output signal of the programmable attenuation amplifier 61, and outputs the amplified signal to the hybrid 30.

The hybrid 30 separates the received signal and transmitted signal, and outputs only the transmitted signal to the transformer 20. The output signal of the transformer 20 is sent to, for example, the twisted pair wire through the pair of input/output terminals TWP1 and TWP2.

Figure 3:
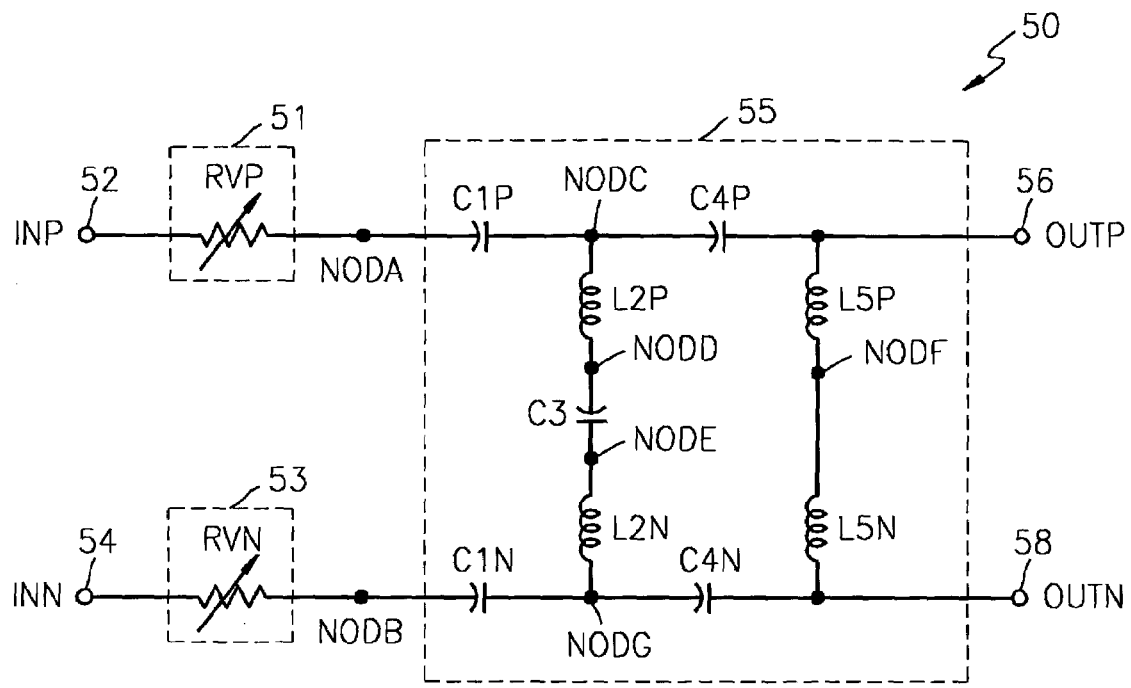
FIG. 3 is a circuit diagram illustrating HPFs according to further embodiments of the present invention.

Referring now to FIG. 3, a circuit diagram of high-pass filters according to embodiments of the present invention will be discussed. The elements of the circuit diagram of FIG. 3 are electrically coupled as illustrated. In particular, as illustrated in FIG. 3, the high-pass filter 50 comprises variable resistors RVP 51 and RVN 53, and a filter 55. The variable resistor RVP 51 is electrically coupled between an input terminal 52 and a node NODA, and the variable resistor RVN 53 is electrically coupled between an input terminal 54 and a node NODB. Input signals INP and INN are input through respective input terminals 52 and 54.

A capacitor C1P is electrically coupled between the node NODA and a node NODC, and a capacitor C1N is electrically coupled between the node NODB and a node NODG. An inductor L2P is electrically coupled between the node NODC and the node NODD. A capacitor C3 is electrically coupled between the node NODD and a node NODE, and an inductor L2N is electrically coupled between the node NODE and a node NODG.

A capacitor C4P is electrically coupled between the node NODC and an output terminal 56, a capacitor C4N is electrically coupled between the node NODG and an output terminal 58, an inductor L5P is electrically coupled between the output terminal 56 and a node NODF, and an inductor L5N is electrically coupled between the node NODF and the output terminal 58. Inductor L2P, capacitor C3 and L2N are serially coupled between a common node C1P and C4P and C1N and C4N, respectively.

Figure 4:
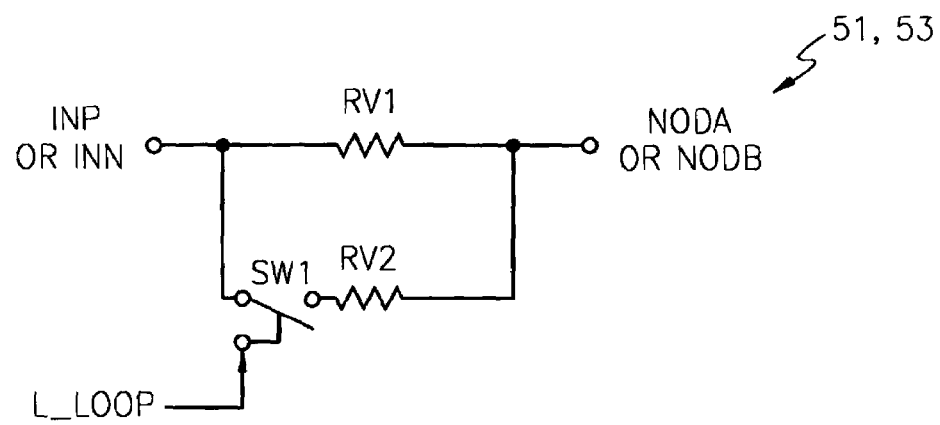
FIG. 4 is a circuit diagram illustrating variable resistors used in embodiments of the HPFs according to embodiments of the present invention illustrated in FIG. 3.

It will be understood that the circuit illustrated in FIG. 4 of the present application is provided for exemplary purposes only and embodiments of the present invention should not be limited to the illustrated configuration. Many equivalent circuits may be used without departing from the teachings of the present invention. For example, the resistors may be replaced with resistive elements and still be within the teachings of the present invention. Furthermore, inductors L5P and L5N may be replaced with a single inductor having an inductance equal to the inductance of L5P and L5N.

Referring now to FIG. 4, a circuit diagram of variable resistors used in the high-pass filters according to embodiments of the present invention illustrated in FIG. 3 will be discussed. Each of the variable resistors 51 and 53 may have a first resistive element, for example, resistor RV1, a second resistive element, for example, resistor RV2, and a switch SW1. The switch SW1 may be activated and/or deactivated in response to a control signal L_LOOP output from the discrete multitone transceiver 80 as discussed above.

Referring to FIGS. 2 and 4, an example using 1KΩ as the value of the first resistor RV1 and 282Ω as the value of the second resistor RV2 will now be explained. If the level of the signal received by the discrete multitone transceiver 80 is lower than a predetermined reference level (hereinafter a "first mode"), the discrete multitone transceiver 80 outputs a deactivated control signal L_LOOP (logic low) to the high-pass filter 50. Accordingly, when the control signal L_LOOP is set to a logic low the switch SW1 is not activated and the resistance of the circuit illustrated in FIG. 4 is 1KΩ, the value of the first resistor RV1. Thus, the resistance of both of the variable resistors 51 and 53 would also be 1 KΩ in this case.

However, if the level of the signal received by the discrete multitone transceiver 80 is higher than the predetermined reference level (hereinafter a "second mode"), the discrete multitone transceiver 80 outputs an activated control signal L_LOOP (logic high) to the high-pass filter 50. When the control signal L_LOOP is set to a logic high the switch SW1 is activated and the resistance of the circuit in FIG. 4 is the value of the first and second resistors RV1 and RV2 in parallel. In particular, the value of a 1KΩ resistor in parallel with a 282Ω resistor is 220Ω [(1000×282)/(1000+282)]. Thus, the value of both of the variable resistors 51 and 53 would also be 220Ω. The passband and/or cutoff frequency of the high-pass filter 50 may vary according to the values of the variable resistors 51 and 53.

Figures 5, 6:
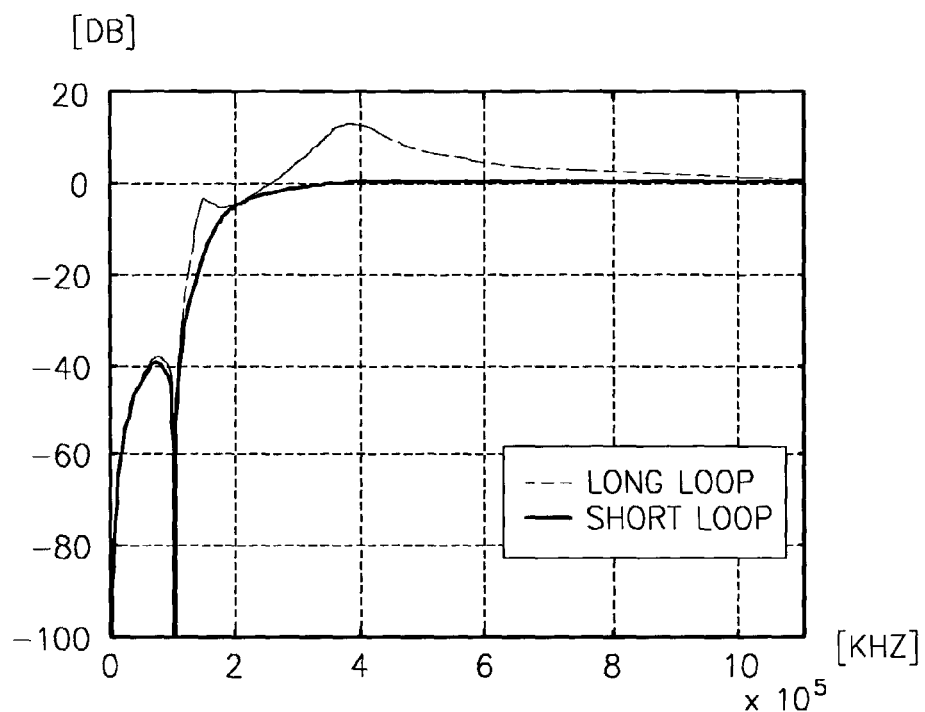
FIG. 5 illustrates frequency characteristics of HPFs according to embodiments of the present invention.
FIG. 6 is a table illustrating data rates of HPFs according to embodiments of the present invention.

FIG. 5 is a chart illustrating frequency characteristics of high-pass filters according to embodiments of the present invention and FIG. 6 is a chart illustrating data rates of high-pass filters according to embodiments of the present invention. Referring now to FIGS. 5 and 6, when the distance between a communications service provider and an ADSL RT modem is between 0 Kft and 6 Kft and the value of both of the variable resistors 51 and 53 is 1KΩ, the received data rate of the discrete multitone transceiver 80 is typically acceptable, for example, from about 9472 Kbs to about 10112 Kbs as illustrated by the chart in FIG. 6. Furthermore, when the distance between a communications service provider and an ADSL RT modem is 9 Kft or greater and the value of both of the variable resistors 51 and 53 are 220 Ω, the received data rate of the discrete multitone transceiver 80 is typically acceptable, for example, from about 4736 Kbs to about 448

Kbs, relative to the same distance when the variable resistances 51 and 53 are 1KΩ, for example, from about 4000 Kbs to about 96 Kbs.

The distance between the communications service provider and the ADSL modem may be determined based on the signal strength (size) of the received signal. In other words, the longer the distance between the communications service provider and the ADSL modem, the weaker the signal strength of the received signal. Furthermore, the weaker the received signal strength, the larger the gain of the analog gain control circuit 67. The discrete multitone transceiver 80 may activate and/or deactivate the control signal L_LOOP based on the gain of the analog gain control circuit 67. For example, the discrete multitone transceiver 80 may activate the control signal L_LOOP when the gain of the analog gain control circuit 67 is greater than or equal to 30 dB.

In other words, if the control signal L_LOOP is activated (logic high) when the distance of a communications service provider and an ADSL RT modem is greater than 9 Kft, the modem 100 may likely receive data at a higher data rate relative to a modem the data rate at distances greater than 9 Kft when the control signal L_LOOP is not activated (logic low). Accordingly, ADSL modems including high pass filters according to embodiments of the present invention may receive acceptable data rates regardless of the distance between the communications service provider and the ADSL RT modem.

A short loop and a long loop are determined relatively based on the threshold of a received data rate. As used herein, a "long loop" means a case where the distance between a communications service provider and an ADSL RT modem is greater than 9 Kft, and a "short loop" means a case where the distance between a communications service provider and an ADSL RT modem is less than 9 Kft. If the control signal L_LOOP is activated when the distance between a communications service provider and an ADSL RT modem is greater than 9 Kft ("long loop") data rates provided by the modem may still be acceptable. Thus, acceptable data rates may be provided regardless of the distance between a communications service provider and an ADSL RT modem.

As described above with respect to FIGS. 2 through 6, the level of a received signal may be compared to a threshold signal level and a control signal may be set based on the result of this comparison. For example, the amplitude of a received signal may be compared to a predetermined signal amplitude. The control signal may be used to adjust a value of a resistor located in a high-pass filter. The ability to adjust the value of this resistor may allow the passband and/or cutoff frequency of a high-pass filter according to embodiments of the present invention to be adjusted. This high pass filter may be used in a ADSL RT modem and may allow signals to be received at increased data rates, regardless of the distance between a communications service provider and the ADSL RT modem.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for adjusting a passband and/or cutoff frequency of a high-pass filter of an ADSL modem which includes a high-pass filter and a DMT transceiver, comprising:
   providing a received ADSL signal to the DMT transceiver through the high-pass filter;
   comparing a level of the received ADSL signal with a predetermined signal level in the DMT transceiver to provide a comparison result;
   generating a control signal based on the comparison result and providing the control signal to the high-pass filter as a feedback signal; and
   adjusting the passband and/or the cutoff frequency of the high-pass filter of the ADSL modem responsive to the control signal.

2. The method of claim 1, wherein adjusting the passband and/or cutoff frequency comprises adjusting a value of at least one resistive element of the high pass filter.

3. The method of claim 2, wherein generating a control signal further comprises:
   setting the control signal to a logic low if the level of the received ADSL signal is lower than the predetermined signal level; and
   setting the control signal to a logic high if the level of the received ADSL signal is higher than the predetermined signal level.

4. The method of claim 3, further comprising activating and/or deactivating a switch responsive to the control signal, wherein the switch activates and/or deactivates the at least one resistive element of the high pass filter.

5. A high-pass filter of an ADSL modem having an adjustable passband and/or cutoff frequency, the ADSL modem including a discrete multitone transceiver (DMT), the high pass filter comprising:
   a high pass filter module configured to receive a first ADSL signal, high-pass filter the first ADSL signal and output a second ADSL signal to the DMT, the DMT including a control signal generating circuit that is configured to compare a level of the second ADSL signal with a predetermined signal level in the DMT to provide a comparison result and output a control signal as a feedback signal to the high-pass filter based on the comparison result; and
   wherein the high pass filter is operatively associated with the control signal generating circuit that adjusts the passband and/or the cutoff frequency of the high-pass filter of the ADSL modem responsive to the control signal.

6. The high-pass filter of claim 5 wherein the filter further comprises at least one resistive element and wherein the filter is further configured to adjust the passband and/or cutoff frequency of the high-pass filter by coupling the at least one resistive element to and/or decoupling the at least one resistive element from the high pass filter.

7. The high-pass filter of claim 5 wherein the control signal generating circuit is further configured to:
   set the control signal to a logic low if the level of the second ADSL signal is lower than the predetermined signal level; and
   set the control signal to a logic high if the level of the second ADSL signal is higher than the predetermined signal level.

8. The high-pass filter of claim 7, further comprising:
   a switch operatively associated with the at least one resistive element and configured to couple the resistive element to and/or decouple the resistive element from the high pass filter responsive to the control signal.

9. The high-pass filter of claim 8 wherein the at least one resistive element includes first and second variable resistors and wherein the first and second variable resistors are responsive to the switch.

10. The high-pass filter of claim 9 wherein the first variable resistor comprises first and second resistors connected in parallel, at least one of the first and second resistors configured to be responsive to the switch and wherein the second variable resistor comprises third and forth resistors connected in parallel, at least one of the third and forth resistors configured to be responsive to the switch.

11. An ADSL modem comprising:
   a circuit that receives a first signal;
   a high-pass filter of the ADSL modem, operably associated with the circuit, that includes a RLC circuit, the high-pass filter configured to receive the first signal, high-pass-filter the first signal, and output a second signal;
   a conversion circuit operably associated with the high-pass filter, the conversion circuit configured to receive the second signal, convert the second signal into a digital signal, and output the digital signal; and
   a discrete multitone transceiver (DMT) including a control signal generating circuit operably associated with the conversion circuit that is configured to compare the amplitude of the digital signal with a predetermined signal amplitude in the DMT to provide a comparison result and output a control signal as a feedback signal to the high-pass filter based on the comparison result, wherein the RLC circuit is configured to adjust a value of a resistor included in the RLC circuit based on the control signal.

12. The ADSL modem of claim 11 wherein the passband and/or cutoff frequency of the high-pass filter is adjusted based on the value of the resistor.

13. A method for controlling a passband and/or cutoff frequency of an ADSL modem, comprising:
   receiving a first signal at a high-pass filter;
   high-pass filtering the first signal using the high-pass filter to provide a second signal, the high-pass filter including a RLC circuit;
   outputting the second signal from the high-pass filter to a discrete multitone transceiver (DMT);
   receiving the second signal at a control signal generating unit of the DMT;
   comparing the amplitude of the second signal with a predetermined amplitude in the DMT to provide a comparison result;
   outputting a control signal based on the comparison result as a feedback signal to the high-pass filter; and
   adjusting a value of a resistor in the RLC circuit in response to the control signal.

14. The method of claim 13 wherein the passband and/or cutoff frequency of the high-pass filter is adjusted based on the value of the resistor.

15. A computer program product for adjusting a passband and/or cutoff frequency of a high-pass filter of an ADSL modem which includes a high-pass filter and a discrete multitone transceiver (DMT), the computer program product comprising:
   a computer-readable storage medium having computer-readable program code embodied in said medium, said computer-readable program code comprising:
   computer readable program code configured to provide a received ADSL signal to the DMT through the high-pass filter;
   computer-readable program code that compares a level of the received ADSL signal with a predetermined signal level in the DMT to provide a comparison result;
   computer readable program code that generates a control signal based on the comparison result and provides the control signal to the high-pass filter as a feedback signal; and
   computer readable program code that adjusts the passband and/or the cutoff frequency of the high-pass filter of the ADSL modem responsive to the control signal.

16. The computer program product of claim 15, wherein the computer program code that adjusts the passband and/or cutoff frequency comprises computer program code that adjusts a value of at least one resistive element of the high pass filter.

17. The computer program product of claim 16, wherein the computer program code that generates a control signal further comprises:
   computer program code that sets the control signal to a logic low if the level of the received ADSL signal is lower than the predetermined signal level; and
   computer program code that sets the control signal to a logic high if the level of the received ADSL signal is higher than the predetermined signal level.

18. The computer program product of claim 17, further comprising computer program code that activates and/or deactivates a switch responsive to the control signal, wherein the switch activates and/or deactivates the at least one resistive element of the high pass filter.

* * * * *